(12) United States Patent
Iwamoto

(10) Patent No.: US 8,421,161 B2
(45) Date of Patent: Apr. 16, 2013

(54) SEMICONDUCTOR DEVICE AND FABRICATION METHOD

(75) Inventor: Kazushige Iwamoto, Miyagi (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 67 days.

(21) Appl. No.: 12/656,320

(22) Filed: Jan. 26, 2010

(65) Prior Publication Data

US 2010/0187639 A1 Jul. 29, 2010

(30) Foreign Application Priority Data

Jan. 28, 2009 (JP) ................................. 2009-016672

(51) Int. Cl.
*H01L 27/088* (2006.01)

(52) U.S. Cl.
USPC ............................. 257/392; 257/391; 438/275

(58) Field of Classification Search .................. 257/190, 257/209, 316, 324, 374, 391, 392; 438/199, 438/258, 266, 275, 585

See application file for complete search history.

(56) References Cited

U.S. PATENT DOCUMENTS 5,418,174 A * 5/1995 Kalnitsky ....................... 438/384
7,323,740 B2 * 1/2008 Park et al. ..................... 257/316

FOREIGN PATENT DOCUMENTS

JP           3221766      8/2001
JP       2002-270825 A    9/2002

* cited by examiner

*Primary Examiner* — Kimberly Rizkallah
*Assistant Examiner* — Errol Fernandes
(74) *Attorney, Agent, or Firm* — Rabin & Berdo, P.C.

(57) ABSTRACT

A semiconductor device has a semiconductor substrate in which first and second wells are formed. The substrate and wells are of the same conductivity type, but the second well has a higher impurity concentration than the first well. High-voltage MOS transistors are formed in the first well, and a low-voltage MOS transistor is formed in the second well. The high-voltage MOS transistors include a first transistor having a gate oxide layer with a first thickness and a second transistor having a gate oxide layer with a second thickness less than the first thickness. The low-voltage MOS transistor has a third gate oxide layer with a third thickness less than the first thickness. The second high-voltage MOS transistor provides efficient current conduction.

9 Claims, 7 Drawing Sheets

SEMICONDUCTOR DEVICE AND FABRICATION METHOD

BACKGROUND OF THE INVENTION

1. Field of the Invention

The present invention relates to a semiconductor device including a plurality of metal-oxide-semiconductor transistors and to its fabrication method.

2. Description of the Related Art

Reduction of the size and cost of electronic devices calls for further downsizing of the power transistors included in such electronic devices. For mobile devices and home appliances a particular need is to integrate control circuits and a plurality of power transistors onto the same semiconductor substrate. In integrated devices of this type, isolation becomes an issue. Known methods of isolating different circuit elements formed on the same semiconductor substrate include local oxidation of silicon (LOCOS) and shallow trench isolation (STI).

In addition to downsizing and higher integration, higher-voltage semiconductor devices are being required. Semiconductor devices that can withstand higher voltages can conduct more driving current. High-voltage semiconductor devices are also resistant to current leakage and latch-up. The voltage withstanding requirements for typical semiconductor devices are a few volts for microcomputer and memory devices, including dynamic random access memory (DRAM), several tens of volts for liquid crystal display drivers, and several hundred volts for high-voltage displays.

Exemplary high-voltage metal-oxide-semiconductor (MOS) transistors and their fabrication methods are disclosed by Fujita in Japanese Patent No. 3221766 and by Oyanagi et al. in Japanese Patent Application Publication No. 2002-270825.

Fujita teaches covering parts of the lightly doped source and drain diffusion layers of a MOS transistor with a resist layer to suppress the increase in their doping concentration when the more heavily doped source and drain regions are formed, and combines this technique with precise control of the size of the lightly doped regions to ensure a reduction in gate overlap capacitance. Fujita also teaches a self-aligned technology in which parts of the lightly doped source and drain diffusion layers are covered by sidewalls that control their size accurately.

Oyanagi et al. teach forming an electric field relaxation layer that overlaps the gate electrode from the drain side and forming the highly doped drain layer at a distance from the gate oxide layer, thereby improving the source-drain breakdown voltage and reducing the gate length.

One common type of semiconductor device using high-voltage MOS transistors is a booster circuit that converts a low input voltage to a high output voltage. This type of booster circuit includes both low-voltage MOS transistors on the input side and high-voltage MOS transistors on the output side. The high-voltage MOS transistors improve the reliability of the device by increasing its breakdown voltage.

The high-voltage (high source-drain breakdown voltage) MOS transistors used in booster circuits have thicker gate oxide layers than do general low-voltage MOS transistors. Since drain current is inversely proportional to gate oxide thickness, it is difficult to obtain drain current efficiently from these high-voltage MOS transistors. To compensate for the increased gate oxide thickness, the gate width has to be increased, making it difficult to reduce the size of the booster circuit.

SUMMARY OF THE INVENTION

An object of the present invention is to provide a high-voltage semiconductor device, such as a MOS transistor, that can be easily reduced in size for use in step-up (booster) and step-down (buck) converters and various other circuits.

Another object is to provide a method of fabricating such a semiconductor device.

The invention provides a semiconductor device having a semiconductor substrate of a first conductivity type. A first well and a second well, both of the first conductivity type, are formed in the semiconductor substrate. The second well has a higher impurity concentration than the first well. A plurality of high-voltage MOS transistors are formed in the first well, and a low-voltage MOS transistor is formed in the second well. The low-voltage MOS transistor has a lower breakdown voltage than the high-voltage MOS transistors. The transistors are mutually isolated by isolation regions.

The high-voltage MOS transistors include a first high-voltage MOS transistor having a gate oxide layer with a first thickness and a second high-voltage MOS transistor having a gate oxide layer with a second thickness less than the first thickness. The low-voltage MOS transistor has a third gate oxide layer with a third thickness less than the first thickness. The second and third thicknesses may be equal.

This semiconductor device can be fabricated by a method that includes first forming the semiconductor substrate, then forming the first and second wells, then forming the gate oxide layers and forming gate electrodes thereon, and finally forming a first diffusion of a second conductivity type in the first well and a second diffusion of the second conductivity type in the second well, the second diffusion having a higher impurity concentration than the first diffusion.

Of the high-voltage MOS transistors in the first well, the second high-voltage MOS transistor, which has the thinner gate oxide layer, provides efficient current conduction while maintaining an adequate breakdown voltage. Because of the efficient current conduction, the gate width of the second high-voltage MOS transistor does not have to be increased, and the size of the semiconductor device can be reduced as compared with conventional high-voltage semiconductor devices.

DETAILED DESCRIPTION OF THE INVENTION

Figure 1:
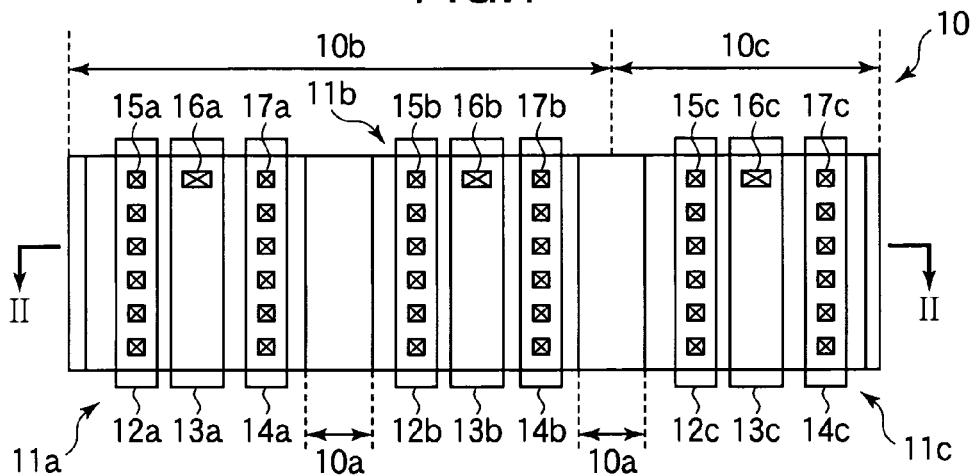
FIG. 1 is a plan view of a semiconductor device in a first embodiment of the invention.

Embodiments of the invention will now be described with reference to the attached drawings, in which like elements are indicated by like reference characters.

For simplicity the drawings show only three transistors, but other transistors, similar to the ones shown, may also be formed in the same semiconductor device.

First Embodiment

Referring to the plan view in FIG. 1, the semiconductor device 10 in the first embodiment includes a high-voltage region 10b and a low-voltage region 10c separated by an isolation region 10a. The high-voltage region 10b is subdivided by another isolation region 10a into two regions, in which respective high-voltage MOS transistors 11a, 11b are formed. Transistor 11a is the first high-voltage MOS transistor and transistor 11b is the second high-voltage MOS transistor. A low-voltage MOS transistor 11c is formed in the high-voltage region 10b. The terms 'high-voltage' and 'low-voltage' refer to the source-drain breakdown voltages of the transistors. These three transistors 11a, 11b, 11c have respective source electrodes 12a, 12b, 12c, gate electrodes 13a, 13b, 13c, and drain electrodes 14a, 14b, 14c from which respective source contact plugs 15a, 15b, 15c, gate contact plugs 16a, 16b, 16c, and drain contact plugs 17a, 17b, 17c extend to the semiconductor surface below.

Figure 2:
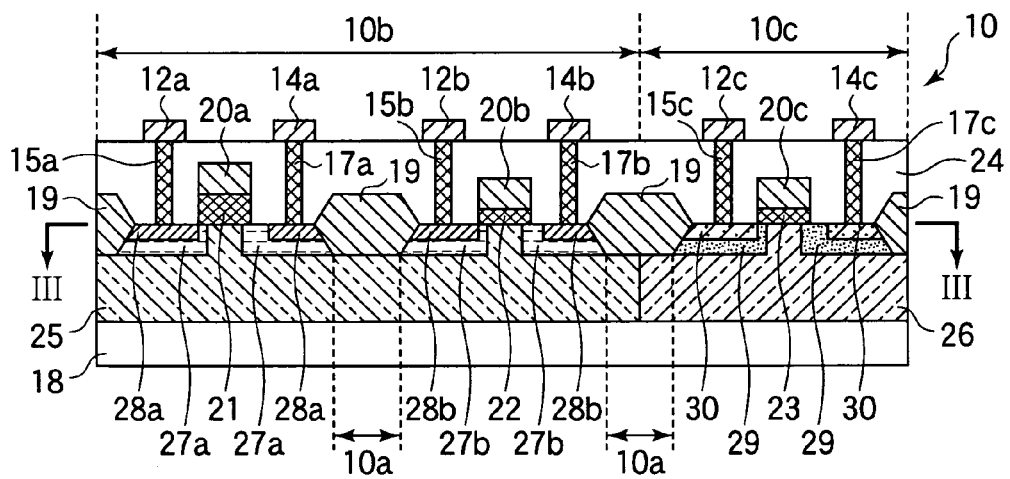
FIG. 2 is a sectional view of the semiconductor device through line II-II in FIG. 1.

Referring to the sectional view in FIG. 2, the semiconductor device 10 has a p-type silicon substrate 18, field oxide layers 19 that define the isolation regions 10a, gate electrodes 20a, 20b, 20c that are connected through the gate contact plugs 16a, 16b, 16c shown in FIG. 1 to the gate electrodes 13a, 13b, 13c shown in FIG. 1, and three dielectric gate oxide films: a first high-voltage gate oxide film 21 formed between gate electrode 20a and the p-type silicon substrate 18, a second high-voltage gate oxide film 22 formed between gate electrode 20b and the p-type silicon substrate 18, and a low-voltage gate oxide film 23 formed between gate electrode 20c and the p-type silicon substrate 18. An inter-layer dielectric film 24 is formed on the p-type silicon substrate 18 and also covers the field oxide layers 19 and gate electrodes 20a, 20b, 20c. The source contact plugs 15a, 15b, 15c, gate contact plugs 16a, 16b, 16c (not visible in FIG. 2), and drain contact plugs 17a, 17b, 17c pass through the inter-layer dielectric film 24 to make contact with the source electrodes 12a, 12b, 12c, gate electrodes 13a, 13b, 13c (not visible in FIG. 2), and drain electrodes 14a, 14b, 14c, which are formed on the surface of the inter-layer dielectric film 24.

A first p-well 25 is formed by boron ion implantation in the p-type silicon substrate 18 in the high-voltage region 10b. A second p-well 26 having a higher impurity concentration than the first p-well 25 is formed by boron ion implantation in the p-type silicon substrate 18 in the low-voltage region 10c. High-voltage lightly doped n-type diffusion layers 27a, 27b and high-voltage heavily doped n-type diffusion layers 28a, 28b are formed in the first p-well 25 by arsenic or phosphorus ion implantation. Low-voltage lightly doped n-type diffusion layers 29 and low-voltage heavily doped n-type diffusion layers 30 are formed by arsenic or phosphorus ion implantation in the second p-well 26. The high-voltage heavily doped n-type diffusion layers 28a, 28b have a higher impurity concentration than the high-voltage lightly doped n-type diffusion layers 27a, 27b, and the low-voltage heavily doped n-type diffusion layers 30 have a higher impurity concentration than the low-voltage lightly doped n-type diffusion layers 29.

Figure 3:
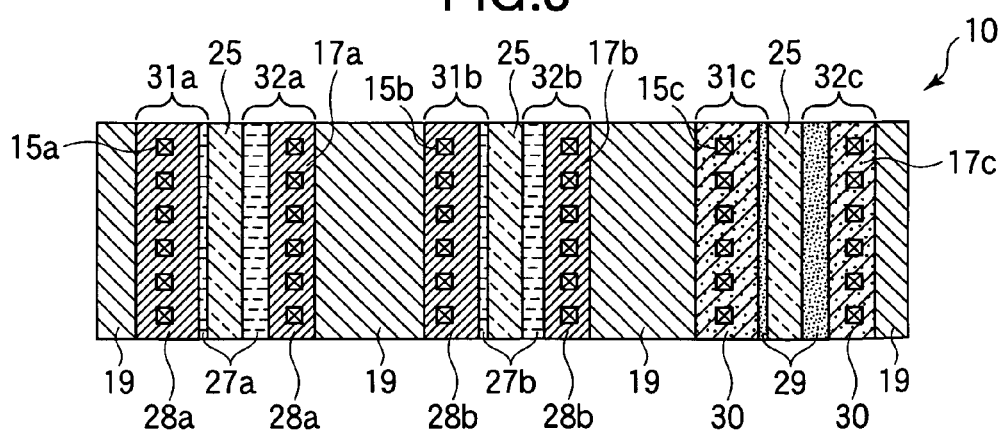
FIG. 3 is a sectional view of the semiconductor device through line in FIG. 2.

As shown in the plan-view section in FIG. 3, in the high-voltage region 10b, a plurality of source contact plugs 15a, 15b or drain contact plugs 17a, 17b make contact with each of the high-voltage heavily doped n-type diffusion layers 28a, 28b. The high-voltage heavily doped n-type diffusion layers 28a, 28b connected to the source contact plugs 15a, 15b and the high-voltage lightly doped n-type diffusion layers 27a, 27b in which these high-voltage heavily doped n-type diffusion layers 28a, 28b are formed constitute source regions 31a, 31b. The high-voltage heavily doped n-type diffusion layers 28a, 28b connected to the drain contact plugs 17a, 17b and the high-voltage lightly doped n-type diffusion layers 27a, 27b in which these high-voltage heavily doped n-type diffusion layers 28a, 28b are formed constitute drain regions 32a, 32b.

In the low-voltage region 10c, a plurality of source contact plugs 15c or drain contact plugs 17c make contact with each of the low-voltage heavily doped n-type diffusion layers 30. The low-voltage heavily doped n-type diffusion layer 30 connected to the source contact plugs 15c and the low-voltage lightly doped n-type diffusion layer 29 in which this low-voltage heavily doped n-type diffusion layer 30 is formed constitute a source region 31c. The low-voltage heavily doped n-type diffusion layer 30 connected to the drain contact plugs 17c and the low-voltage lightly doped n-type diffusion layer 29 in which this low-voltage heavily doped n-type diffusion layer 30 is formed constitute a drain region 32c.

Similarly, the gate electrodes 20a, 20b, 20c and gate oxide layers 21, 22, 23 (not visible in FIG. 3) constitute gate regions positioned generally between the corresponding source regions and drain regions.

As shown in FIGS. 2 and 3, in the high-voltage region 10b, the high-voltage lightly doped n-type diffusion layers 27a, 27b in the source regions 31a, 31b are separated from the high-voltage lightly doped n-type diffusion layers 27a, 27b in the drain regions 32a, 32b by parts of the first p-well 25. The high-voltage lightly doped n-type diffusion layers 27a, 27b extend partway into the regions beneath the high-voltage gate oxide films 21, 22 so that at least part of each of the high-voltage lightly doped n-type diffusion layers 27a, 27b faces part of the first high-voltage gate oxide film 21 or second high-voltage gate oxide film 22. The high-voltage heavily doped n-type diffusion layers 28a, 28b do not extend beneath the high-voltage gate oxide films 21, 22. In particular, the high-voltage heavily doped n-type diffusion layers 28a, 28b in the drain regions 32a, 32b are disposed at a distance from the high-voltage gate oxide films 21, 22. No part of any of the high-voltage heavily doped n-type diffusion layers 28a, 28b faces the first high-voltage gate oxide film 21 or the second high-voltage gate oxide film 22.

In the low-voltage region 10c, similarly, the low-voltage lightly doped n-type diffusion layer 29 in the source region 31c is separated from the low-voltage lightly doped n-type diffusion layer 29 in the drain region 32c by part of the second p-well 26, and each low-voltage lightly doped n-type diffusion layer 29 extends partway beneath the low-voltage gate oxide film 23, so that at least part of the low-voltage lightly doped n-type diffusion layer 29 faces part of the low-voltage gate oxide film 23. The low-voltage heavily doped n-type diffusion layers 30 do not extend beneath the low-voltage gate oxide film 23, and in particular, the low-voltage heavily doped n-type diffusion layer 30 in the drain region 32c is disposed at a distance from the low-voltage gate oxide film 23. No part of either low-voltage heavily doped n-type diffusion layer 30 faces the low-voltage gate oxide film 23.

In this embodiment, the first and second high-voltage MOS transistors 11a and 11b formed in the high-voltage region 10b differ only in the thickness of their gate oxide layers. Specifically, the first high-voltage gate oxide film 21 is thicker than the second high-voltage gate oxide film 22. For example, the thickness of the first high-voltage gate oxide film 21 may be about forty to fifty nanometers (40 to 50 nm), and the thickness of the second high-voltage gate oxide film 22 may be about 7 to 12 nm. The thickness of the second high-voltage gate oxide film 22 is the same as the thickness of the low-voltage gate oxide film 23. Because drain current is in inverse proportion to the thickness of the gate oxide layer, the comparative thinness of the second high-voltage gate oxide film 22 enables the second high-voltage MOS transistor 11b to conduct more current per unit gate width than the first high-voltage MOS transistor 11a. Despite the reduced thickness of the second high-voltage gate oxide film 22, however, the breakdown voltage of the second high-voltage MOS transistor 11b is, for example, about ten to twelve volts (10 to 12 V). This compares with breakdown voltages of, for example, about 15 V for the first high-voltage MOS transistor 11a and about 5 V for the low-voltage MOS transistor 11c in this embodiment.

It is not necessary for the second high-voltage gate oxide film 22 and the low-voltage gate oxide film 23 to have the same thickness, provided the second high-voltage gate oxide film 22 is thick enough to give the second high-voltage MOS transistor 11b a breakdown voltage of at least, for example, about 10 V. If this condition is met, the second high-voltage gate oxide film 22 may be thinner than the low-voltage gate oxide film 23 or, if necessary, the second high-voltage gate oxide film 22 may be thicker than the low-voltage gate oxide film 23.

Figure 4:
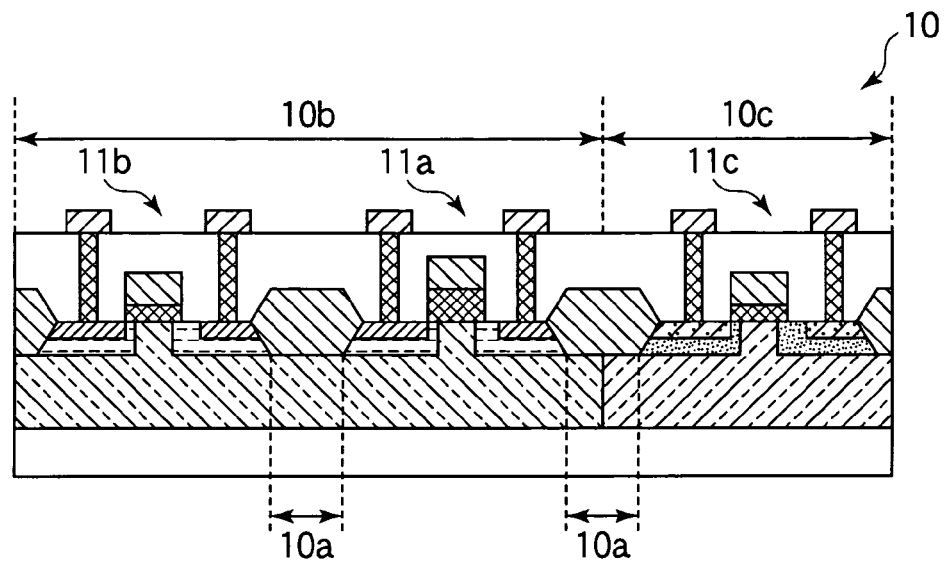
FIGS. 4 and 5 are sectional views of variations of the semiconductor device in the first embodiment.
Figure 5:
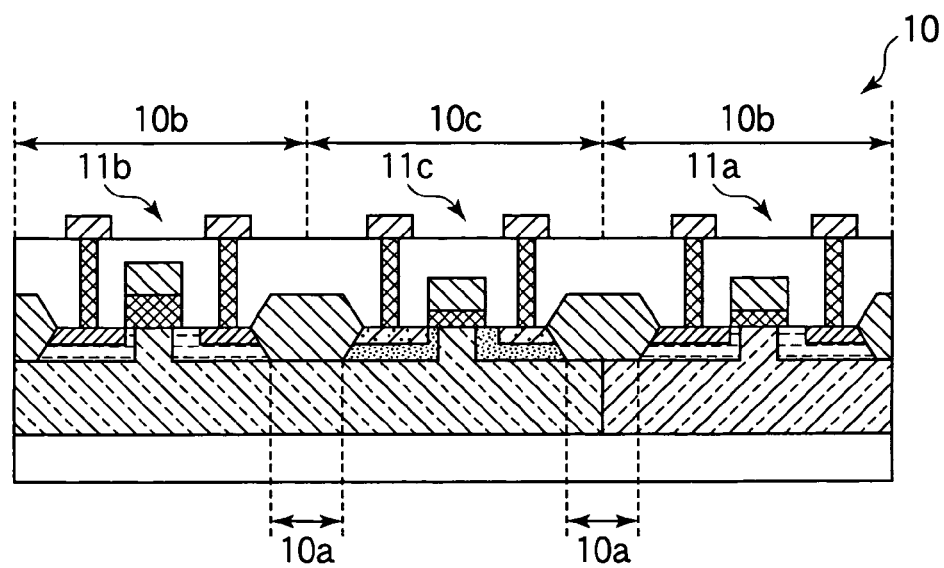

The layout of MOS transistors 11a, 11b, 11c in the semiconductor device 10 is not limited to the illustrative layout shown in FIGS. 1 to 3. For example, the first high-voltage MOS transistor 11a, having the thickest gate oxide layer, may be positioned between the second high-voltage MOS transistor 11b and the low-voltage MOS transistor 11c as shown in FIG. 4, or the low-voltage MOS transistor 11c may be positioned between the first and second high-voltage MOS transistors 11a, 11b as shown in FIG. 5. The selection among the layouts in FIGS. 2, 4, and 5 is a design choice that can be made according to the overall circuit structure of the semiconductor device 10 and the electronic device in which it is used.

Next, the fabrication process of the semiconductor device in the first embodiment will be described with reference to the sectional views in FIGS. 6 to 22.

Figure 6:
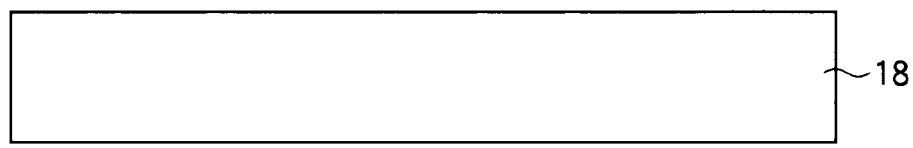
FIGS. 6 to 22 are sectional views illustrating a fabrication process for the semiconductor device in the first embodiment.

First a p-type silicon substrate 18 is prepared as a semiconductor substrate (FIG. 6).

Figure 7:
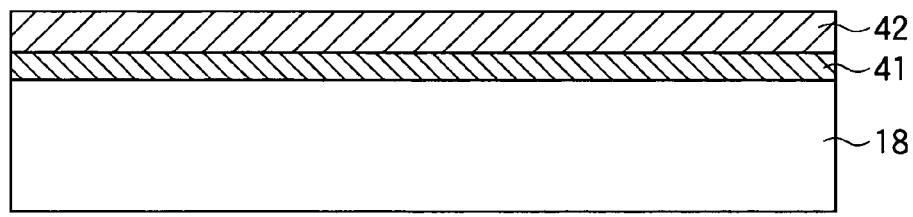
Figure 8:
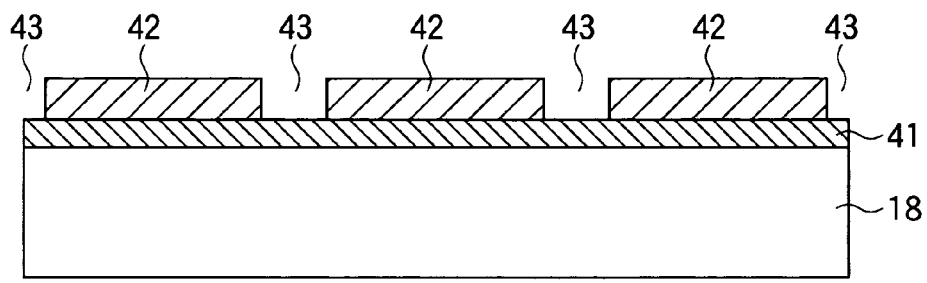
Figure 9:
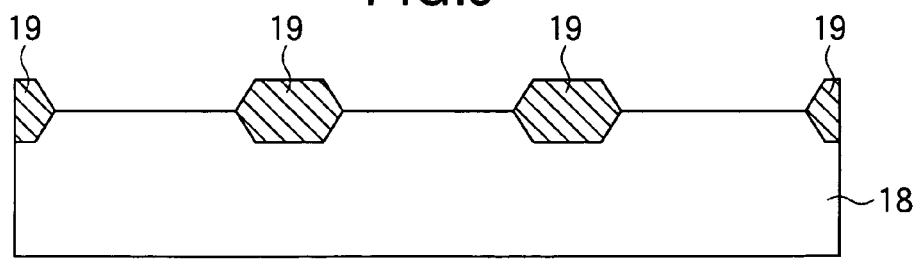

Next the field oxide layers 19 are formed by the LOCOS process. More specifically, a heat treatment process is carried out to grow a silicon dioxide layer 41 on the surface of the p-type silicon substrate 18 by thermal oxidation, and a first silicon oxide layer 42 is deposited on the silicon dioxide layer 41 by a reaction between ammonia and silane gases (FIG. 7). A resist (not shown) is applied to the deposited first silicon oxide layer 42. The resist is patterned by lithography. Openings 43 are formed in the first silicon oxide layer 42 by dry etching, using the patterned resist as a mask (FIG. 8). The field oxide layers 19 are grown in the parts of the silicon dioxide layer 41 exposed by the openings 43, by heat treatment of the p-type silicon substrate 18 in an oxygen atmosphere, using the first silicon oxide layer 42 with the openings 43 as a mask. Next, the first silicon oxide layer 42 is removed with hot phosphorus, and the silicon dioxide layer 41 is removed with fluorine, from the regions in which the field oxide layers 19 have not been grown. The result is a completed set of field oxide layers 19 that divide the p-type silicon substrate 18 into isolated element regions (FIG. 9). Alternatively, the field oxide layers 19 may be formed by an STI process instead of a LOCOS process.

Figure 10:
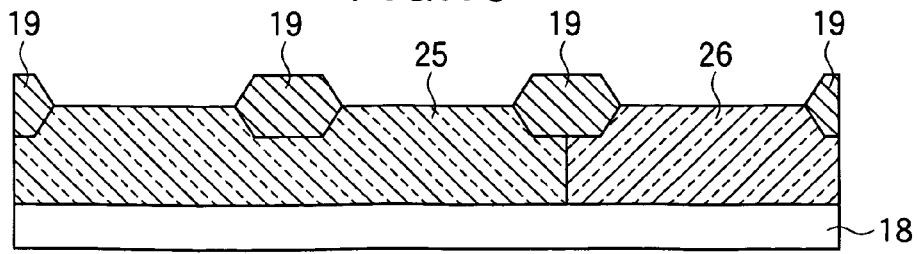

Next, a resist (not shown) is applied to the surface (the major surface) of the p-type silicon substrate 18 on which the field oxide layers 19 are formed. The resist is patterned by lithography. The first p-well 25 is formed by boron ion implantation to a desired depth from the major surface of the p-type silicon substrate 18, using the patterned resist as a mask. The resist mask for the first p-well 25 is removed, and a new resist (also not shown) is applied. The new resist is patterned by lithography. A second p-well 26 having a higher impurity concentration than the first p-well 25 is formed by boron ion implantation to a desired depth from the major surface of the p-type silicon substrate 18, using the new patterned resist as a mask. FIG. 10 shows the first and second p-wells 25, 26.

It is not necessary to form the first and second p-wells 25, 26 in the above order; the second p-well 26 may be formed before the first p-well 25. Alternatively, boron ions may be implanted at a comparatively low concentration into the entire major surface of the p-type silicon substrate 18 without using a resist mask, and then further boron ions may be implanted through a resist mask to form the second p-well 26, the masked region that does not receive the additional boron ions becoming the first p-well 25.

Figure 11:
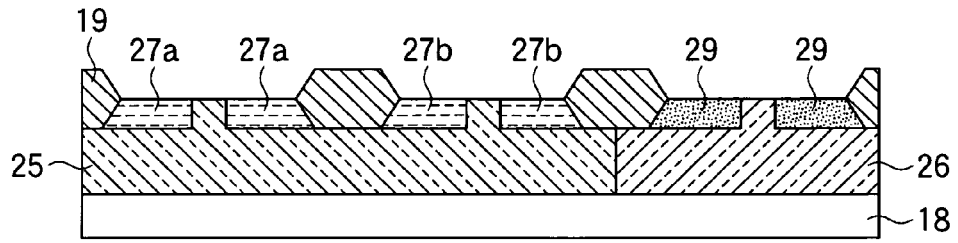

Next, a resist (not shown) is applied to the major surface of the p-type silicon substrate 18. The resist is patterned by lithography. The high-voltage lightly doped n-type diffusion layers 27a, 27b are formed by phosphorus or arsenic ion implantation, using the patterned resist as a mask. A pair of high-voltage lightly doped n-type diffusion layers 27a, 27b is formed in each of the isolated regions defined by the field oxide layers 19 in the first p-well 25, extending from mutually opposite edges of the isolated region to a position near the center of the isolated region, leaving a space between the two high-voltage lightly doped n-type diffusion layers 27a, 27b in the center of the isolated region. The resist mask for the high-voltage lightly doped n-type diffusion layers 27a, 27b is then removed, and a new resist is applied. Next, the new resist is patterned by lithography and the low-voltage lightly doped n-type diffusion layers 29 are formed by phosphorus or arsenic ion implantation, using the patterned resist as a mask. A pair of low-voltage lightly doped n-type diffusion layers 29 is formed in the isolated region defined by the field oxide layers 19 in the second p-well 26, extending from opposite edges of the isolated region to a position near the center of the isolated region, leaving a space between the two low-voltage lightly doped n-type diffusion layers 29 in the center of the isolated region. FIG. 11 illustrates the lightly doped n-type diffusion layers 27a, 27b, 29 thus formed. The impurity concentration is lower in the high-voltage lightly doped n-type diffusion layers 27a, 27b than in the low-voltage lightly doped n-type diffusion layers 29.

It is not necessary to form the high-voltage lightly doped n-type diffusion layers 27a, 27b and the low-voltage lightly doped n-type diffusion layers 29 in the above order; the low-voltage lightly doped n-type diffusion layers 29 may be formed before the high-voltage lightly doped n-type diffusion layers 27a, 27b.

Figure 12:
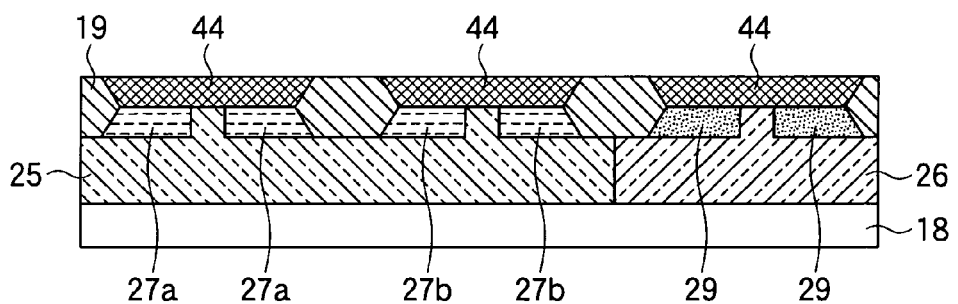
Figure 13:
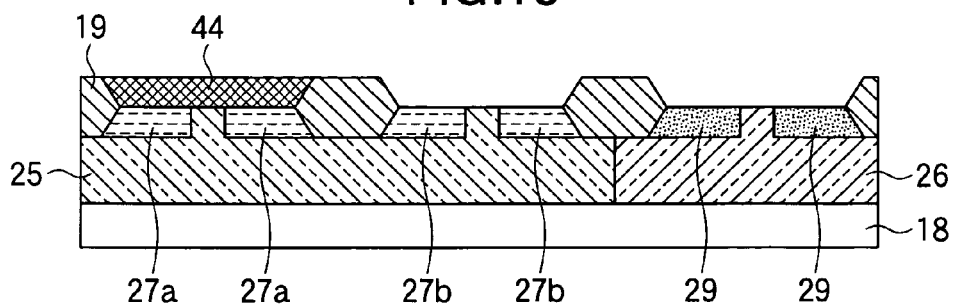
Figure 14:
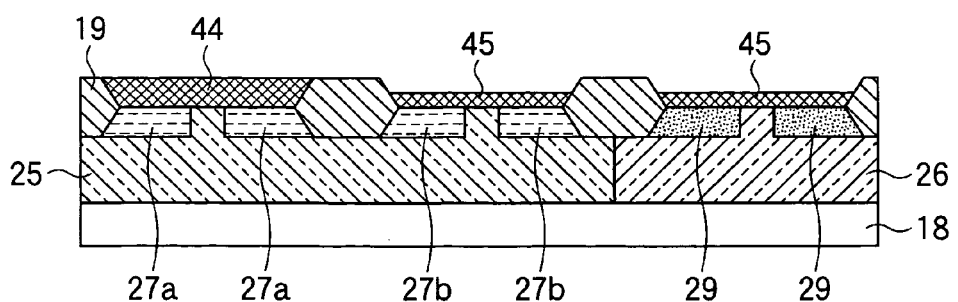

Next, a second silicon oxide layer 44 is grown on the major surface of the p-type silicon substrate 18 in the isolated regions bounded by the field oxide layers 19 (FIG. 12). The thickness of the second silicon oxide layer 44 is, for example, about 40 to 50 nm. Then a resist (not shown) is applied to the second silicon oxide layer 44 and the field oxide layers 19. The resist is patterned by lithography. The second silicon oxide layer 44 is selectively removed from the isolated regions in which lightly doped n-type diffusion layers 27b and 29 are formed, by dry etching using the patterned resist as a mask. The second silicon oxide layer 44 is left intact on the isolated region in which lightly doped n-type diffusion layers 27a are formed (FIG. 13). The resist mask used to remove the second silicon oxide layer 44 is left in place and a third silicon oxide layer 45 is now formed on the isolated regions in which lightly doped n-type diffusion layers 27b and 29 are formed, on the major surface of the p-type silicon substrate 18, by thermal oxidation (FIG. 14). The thickness of the third silicon oxide layer 45 is about 7 to 12 nm, for example, and is less than the thickness of the second silicon oxide layer 44.

If necessary, additional steps may now be carried out to form silicon oxide layers of different thicknesses on the isolated region in which high-voltage lightly doped n-type diffusion layers 27b are formed and the isolated region in which the low-voltage lightly doped n-type diffusion layers 29 are formed. For example, the third silicon oxide layer 45 may be removed from the isolated region in which the low-voltage lightly doped n-type diffusion layers 29 are formed and a new silicon oxide layer 45 with a different thickness may be formed on this region, using a new resist mask that exposes only this isolated region. Alternatively, the third silicon oxide layer 45 may be removed from the isolated region in which high-voltage lightly doped n-type diffusion layers 27b are formed and a new silicon oxide layer 45 with a different thickness may be formed on this region. These additional steps are unnecessary when the intended thicknesses of the gate oxide layers of the second high-voltage MOS transistor 11b and low-voltage MOS transistor 11c are both the same.

Figure 15:
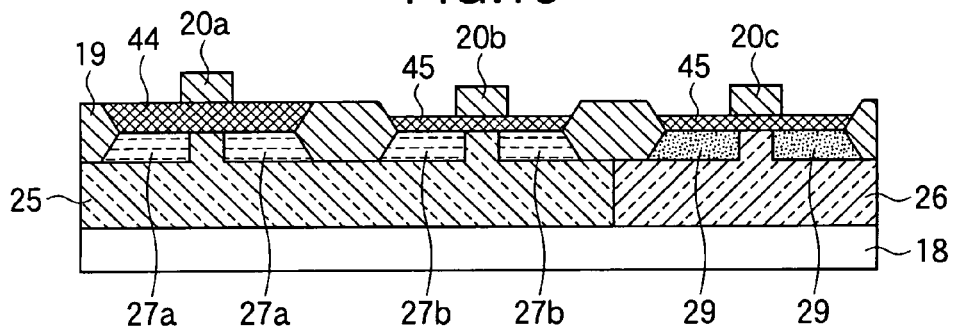

Next, a polycrystalline silicon layer is grown by thermal decomposition of silane gas in nitrogen gas by chemical vapor deposition (CVD). The polycrystalline silicon layer is doped by adding a conductive impurity such as phosphorus during or after the CVD growth process. A resist (not shown) is applied to the doped polycrystalline silicon layer. The resist is patterned by lithography. Gate electrodes 20a, 20b, 20c having a desired shape are formed by dry etching of the doped polycrystalline silicon layer, using the patterned resist as a mask (FIG. 15). The gate electrodes 20a, 20b, 20c are formed in positions such that their edges overlap at least parts of each of the high-voltage lightly doped n-type diffusion layers 27a, 27b and low-voltage lightly doped n-type diffusion layers 29.

Figure 16:
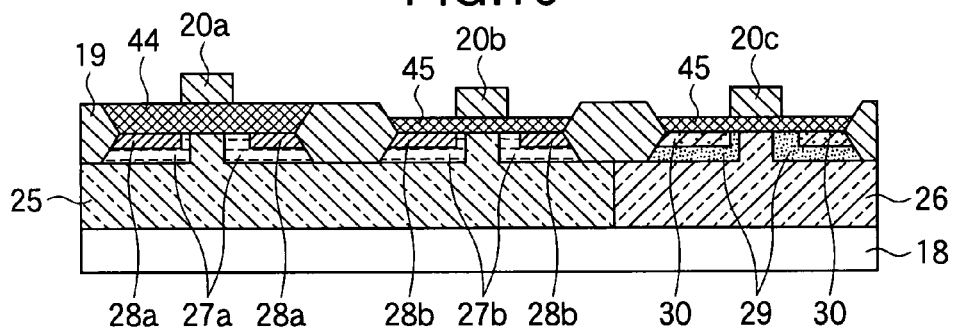

Next, a resist (not shown) is applied to the field oxide layers 19, gate electrodes 20a, 20b, 20c, second silicon oxide layer 44, and third silicon oxide layer 45. The resist is patterned by lithography. The high-voltage heavily doped n-type diffusion layers 28a, 28b are formed in predetermined regions in the high-voltage lightly doped n-type diffusion layers 27a, 27b, by phosphorus or arsenic ion implantation through the second and third silicon oxide layers 44, 45, using the patterned resist as a mask. One of each pair of high-voltage heavily doped n-type diffusion layers 28a or 28b is formed by self-alignment with gate electrode 20a or 20b, the other high-voltage heavily doped n-type diffusion layer 28a or 28b in the pair being formed at a distance from gate electrode 20a or 20b. The resist mask for the high-voltage heavily doped n-type diffusion layers 28a, 28b is then removed and a new resist is applied. The new resist is patterned by lithography. The low-voltage heavily doped n-type diffusion layers 30 are formed by phosphorus or arsenic ion implantation, using the patterned resist as a mask. One of the low-voltage heavily doped n-type diffusion layers 30 is formed in self-alignment with gate electrode 20c, and the other is formed at a distance from gate electrode 20c. FIG. 16 illustrates the heavily doped n-type diffusion layers 28a, 28b, 30. The impurity concentration is lower in the high-voltage heavily doped n-type diffusion layers 28a, 28b than in the low-voltage heavily doped n-type diffusion layers 30.

It is not necessary to form the high-voltage heavily doped n-type diffusion layers 28a, 28b and the low-voltage heavily doped n-type diffusion layers 30 in the above order; the low-voltage heavily doped n-type diffusion layers 30 may be formed before the high-voltage heavily doped n-type diffusion layers 28a, 28b.

Figure 17:
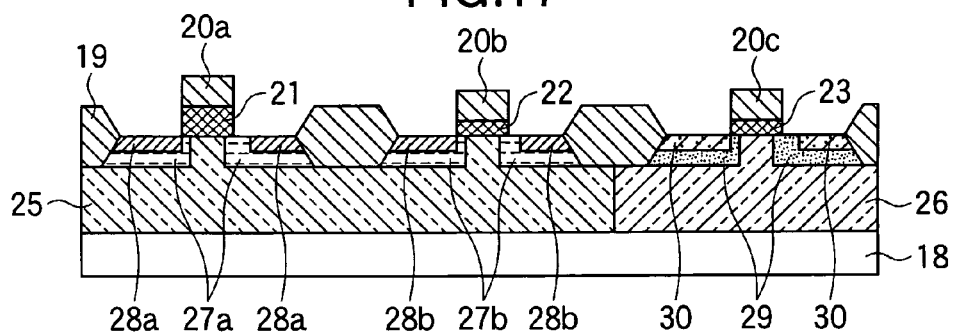

Next, a resist (not shown) is applied to the field oxide layers 19, gate electrodes 20a, 20b, 20c, second silicon oxide layer 44, and third silicon oxide layer 45. The resist is patterned by lithography. The second silicon oxide layer 44 and the third silicon oxide layer 45 are removed by dry etching except from the regions where they are sandwiched between the p-type silicon substrate 18 and the gate electrodes 20a, 20b, 20c, using the patterned resist as a mask. The parts of the second silicon oxide layer 44 and third silicon oxide layer 45 that are left sandwiched between the p-type silicon substrate 18 and the gate electrodes 20a, 20b, 20c become the first high-voltage gate oxide film 21, the second high-voltage gate oxide film 22, and the low-voltage gate oxide film 23 (FIG. 17).

Figure 18:
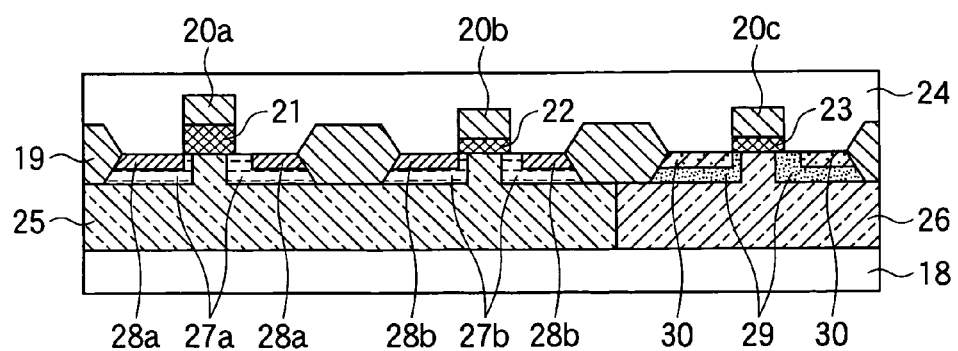

Next, the inter-layer dielectric film 24 is formed by CVD, using silane gas and oxygen gas, on the p-type silicon substrate 18, the field oxide layers 19, the gate electrodes 20a, 20b, 20c, and the gate oxide films 21, 22, 23. The surface of the inter-layer dielectric film 24 is then planarized by chemical-mechanical polishing (CMP). FIG. 18 illustrates the planarized surface.

Figure 19:
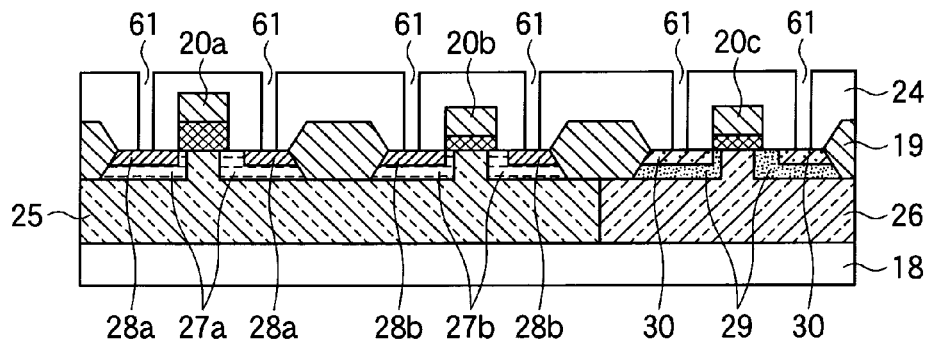

Next a resist (not shown) is applied to the inter-layer dielectric film 24. The resist is patterned by lithography. Contact holes 61 penetrating through the inter-layer dielectric film 24 to the heavily doped n-type diffusion layers 28a, 28b, 30 are formed by dry etching, using the patterned resist as a mask (FIG. 19). Contact holes (not shown) extending to the gate electrodes 20a, 20b, 20c are formed simultaneously. The patterned resist is removed after formation of the contact holes.

Figure 20:
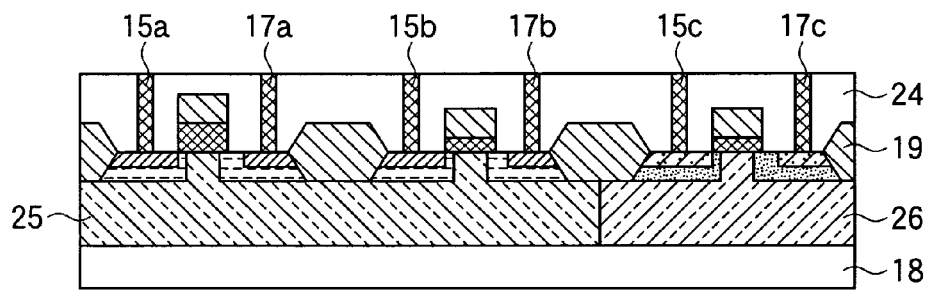

A layer of tungsten is now deposited on the inter-layer dielectric film 24 by CVD, filling the contact holes 61. After the tungsten deposition, the tungsten layer is polished by CMP until the surface of the inter-layer dielectric film 24 is exposed. The tungsten remaining in the contact holes forms the source contact plugs 15a, 15b, 15c and drain contact plugs 17a, 17b, 17c that extend to the heavily doped n-type diffusion layers 28a, 28b, 30 (as shown in FIG. 20), and the gate contact plugs 16a, 16b, 16c (not visible in FIG. 20) that extend to the gate electrodes.

Figure 21:
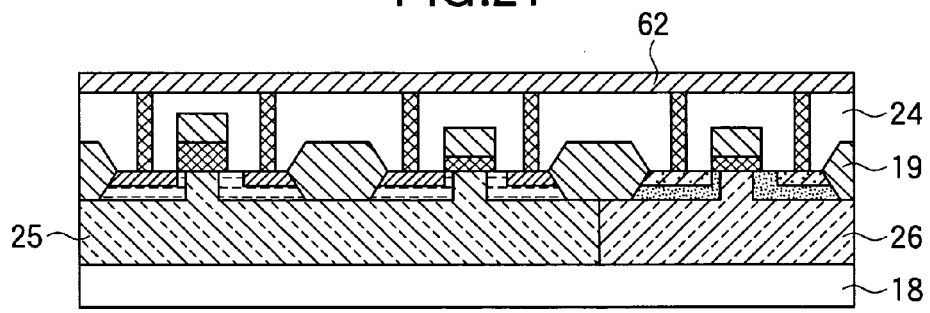
Figure 22:
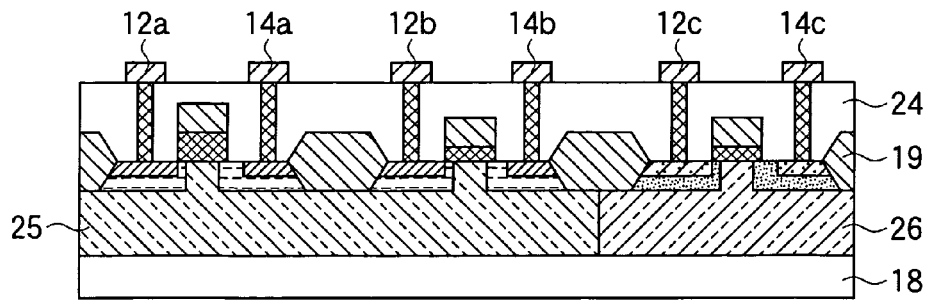

An aluminum film 62 is now formed by sputtering on the inter-layer dielectric film 24. The aluminum film 62 makes electrical contact with the ends of the source contact plugs 15a, 15b, 15c, gate contact plugs 16a, 16b, 16c, and drain contact plugs 17a, 17b, 17c, (FIG. 21). A resist (not shown) is applied to the aluminum film 62 and patterned by lithography. The aluminum film 62 is then patterned by dry etching, using the patterned resist as a mask. This dry etching process forms the source electrodes 12a, 12b, 12c, gate electrodes 13a, 13b, 13c, and drain electrodes 14a, 14b, 14c (FIG. 22). The gate electrodes 13a, 13b, 13c are not visible in FIG. 22.

Further processes (not illustrated) may now be carried out to form additional layers of metal interconnection wiring to complete the semiconductor device 10.

A process similar to that described above may be carried out to form a semiconductor device in which the conductivity types (p and n) of the silicon substrate, the wells, and the diffusion layers differ from the types described above.

The semiconductor device described above has a plurality of high-voltage MOS transistors formed in a first well in a semiconductor substrate and a low-voltage MOS transistor formed in a second well in the semiconductor substrate. The high-voltage MOS transistors include a first high-voltage MOS transistor having a gate oxide layer thicker than the gate oxide layer of the low-voltage MOS transistor, and a second high-voltage MOS transistor having a gate oxide layer thinner than the gate oxide layer of the first high-voltage MOS transistor. The second high-voltage MOS transistor is structured so as to provide an adequately high breakdown voltage, but since its gate oxide layer is thinner than the gate oxide layers of conventional high-voltage MOS transistors, it can conduct current more efficiently than a conventional high-voltage MOS transistor, when the same gate voltage is applied. Therefore, an efficient current flow can be obtained without increasing the gate size of the second high-voltage MOS transistor, and the size of the semiconductor device can be reduced accordingly. Semiconductor devices of this type are useful in numerous applications, including booster circuits and buck circuits, to reduce circuit size while maintaining an adequately high breakdown voltage.

As noted above, the only difference between the first and second high-voltage MOS transistors 11a and 11b in the first embodiment is the thickness of their gate oxide layers, but in a variation of the first embodiment, but the impurity concentrations in the diffusion regions of these transistors may also differ. For example, the impurity concentration may be higher in high-voltage lightly doped n-type diffusion layers 27b than in high-voltage lightly doped n-type diffusion layers 27a.

Second Embodiment

The semiconductor device in the second embodiment has a third p-well, referred to below as an additional second p-well 26, formed in the high-voltage region 10b. The structure and fabrication process of this semiconductor device and the effect of the additional second p-well 26 will now be described.

Figure 23:
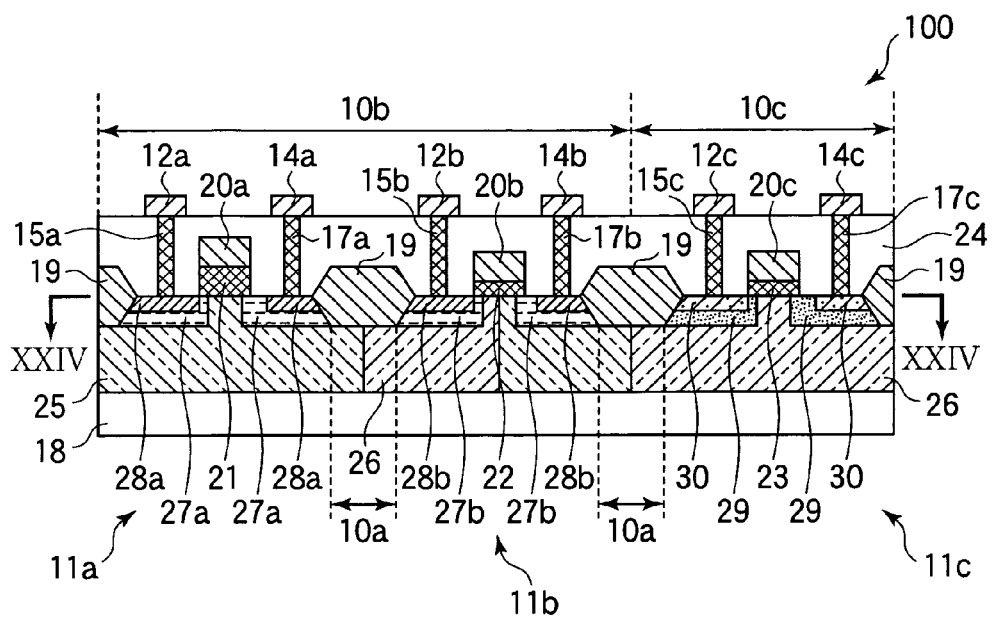
FIG. 23 is a sectional view of a semiconductor device in a second embodiment.
Figure 24:
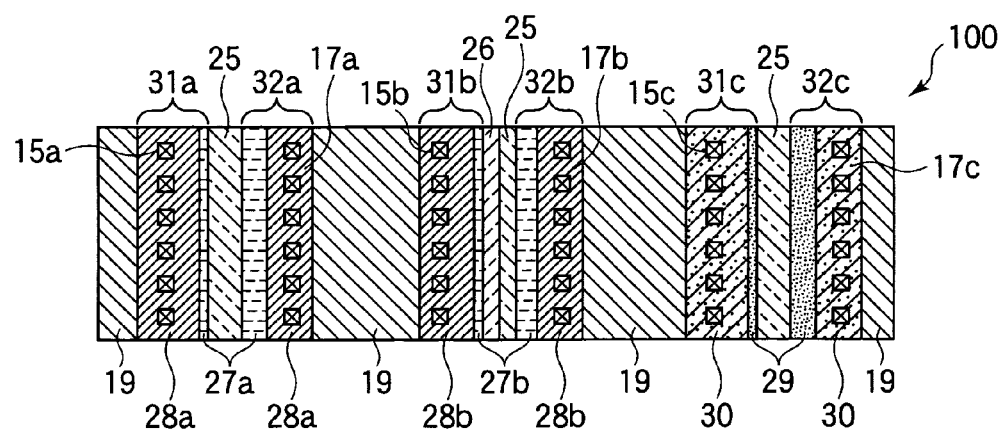
FIG. 24 is a sectional view of this semiconductor device through line XXIV-XXIV in FIG. 23.

As shown in FIGS. 23 and 24, the additional second p-well 26 surrounds the source region 31b of the second high-voltage MOS transistor 11b formed in the high-voltage region 10b of this semiconductor device 100. The drain region 32b is surrounded by the first p-well 25, as in the first embodiment. The additional second p-well 26 extends from beneath the center of the field oxide layer 19 that isolates the second high-voltage MOS transistor 11b from the first high-voltage MOS transistor 11a to a position beneath the gate oxide film 22 of the second high-voltage MOS transistor 11b. In other respects, this semiconductor device 100 has the same structure as the semiconductor device 10 in the first embodiment; a detailed description will be omitted.

The semiconductor device 100 in the second embodiment is fabricated by the same process as the semiconductor device 10 in the first embodiment except for the positions of the first and second p-wells 25, 26, and the patterns of the resist masks used in forming these p-wells 25, 26. In particular, the resist mask for the ion implantation that forms the second p-well 26 is patterned so as to also expose the region from approximately the center of the field oxide layer 19 that isolates the second high-voltage MOS transistor 11b from the first high-voltage MOS transistor 11a to approximately the center of the gate oxide film 22 of the second high-voltage MOS transistor 11b.

The semiconductor device 100 in the second embodiment provides the effects as described in the first embodiment in terms of device size and breakdown voltage. In addition, when the second high-voltage gate oxide film 22 and the low-voltage gate oxide film 23 the semiconductor device 100 have the same thickness, the second embodiment can prevent current leakage, because the additional second p-well 26 surrounding the source region 31b of the second high-voltage MOS transistor 11b has a higher impurity concentration than the first p-well 25 surrounding the drain region 32b. The higher impurity concentration increases the voltage that must be applied to gate electrode 20b to create an inversion layer (the threshold voltage), compensating for the reduction of the threshold voltage due to the thinness of the second high-voltage gate oxide film 22. Preventing a reduction of the threshold voltage has the effect of preventing current leakage when the second high-voltage MOS transistor 11b is switched off.

The second p-well 26 surrounding the source region 31b in the second high-voltage MOS transistor 11b need not have the same impurity concentration as the second p-well 26 in which the low-voltage MOS transistor 11c is formed. It suffices for the second p-well 26 to have an impurity concentration sufficiently higher than the impurity concentration the first p-well 25 that current leakage is prevented.

The positions of the source and drain of the second high-voltage MOS transistor 11b in the second embodiment may be interchanged. That is, the positions of the source electrode 12b, the source contact plugs 15b, the additional second p-well 26, and its high-voltage lightly doped n-type diffusion layer 27b and high-voltage heavily doped n-type diffusion layer 28b may be interchanged with the positions of the drain electrode 14b, the drain contact plugs 17b, the relevant part of the first p-well 25, and its high-voltage lightly doped n-type diffusion layer 27b and high-voltage heavily doped n-type diffusion layer 28b, so that drain region 32b is adjacent the first high-voltage MOS transistor 11a and source region 31b is adjacent the low-voltage MOS transistor 11c. In this structure, the distance between the source of the second high-voltage MOS transistor 11b and the source of the low-voltage MOS transistor 11c can be reduced, so the size of the isolation region 10a (and field oxide layer 19) isolating these two transistors can be reduced.

In the above description the first high-voltage MOS transistor 11a and second high-voltage MOS transistor 11b differ only in regard to their gate oxide thickness and well structure, but as in the first embodiment, they may also differ in the impurity concentration in their diffusion regions. For example, the impurity concentration may be higher in high-voltage lightly doped n-type diffusion layers 27b than in high-voltage lightly doped n-type diffusion layers 27a.

Those skilled in the art will recognize that further variations are possible within the scope of the invention, which is defined in the appended claims.

What is claimed is:

1. A semiconductor device having a semiconductor substrate of a first conductivity type, a first well of the first conductivity type with a first impurity concentration and a second well of the first conductivity type with a second impurity concentration higher than the first impurity concentration being formed in the semiconductor substrate, a plurality of high-voltage MOS transistors being formed in the first well, a low-voltage MOS transistor being formed in the second well, the low-voltage MOS transistor having a lower breakdown voltage than the high-voltage MOS transistors, and isolation regions being formed to isolate each of the plurality of high-voltage MOS transistors and the low-voltage MOS transistor, an isolation region being defined by a field oxide layer formed on a surface of the first well, or partly on a surface of the first well and partly on a surface of the second well, and extending into an interlayer dielectric film, wherein:

the plurality of high-voltage MOS transistors includes a first high-voltage MOS transistor having a first gate oxide layer with a first thickness and having a top surface in contact with a first gate electrode, a bottom surface in contact with the first well, and side surfaces aligned with side surfaces of the first gate electrode and in contact with the interlayer dielectric film, and a second high-voltage MOS transistor having a second gate oxide layer with a second thickness less than the first thickness and having a top surface in contact with a second gate electrode, a bottom surface in contact with the first well, and side surfaces aligned with side surfaces of the second gate electrode and in contact with the interlayer dielectric film;

the low-voltage MOS transistor has a third gate oxide layer with a third thickness less than the first thickness and having a top surface in contact with a third gate electrode, a bottom surface in contact with the second well, and side surfaces aligned with side surfaces of the third gate electrode and in contact with the interlayer dielectric film;

the first high-voltage MOS transistor further includes a pair of first high-voltage lightly doped second conductivity type diffusion layers, the first gate electrode being formed in positions such that edges of the first gate electrode overlap at least parts of each of the first high-voltage lightly doped second conductivity type diffusion layers, and one of the first high-voltage lightly doped second conductivity type diffusion layers having a top surface in contact with the interlayer dielectric film, and a pair of first high-voltage heavily doped second conductivity type diffusion layers, one of the first high-voltage heavily doped second conductivity type diffusion layers being formed in one of the first high-voltage lightly doped second conductivity type diffusion layers by self-alignment with the first gate electrode, the other being formed in the other of the first high-voltage lightly doped second conductivity type diffusion layers at a distance along the top surface of the one of the pair of first high-voltage lightly doped second conductivity type diffusion layers from the first gate electrode, and having a top surface in contact with the interlayer dielectric film and a side surface in contact with a field oxide layer of an isolation region; and the second high-voltage MOS transistor further includes a pair of second high-voltage lightly doped second conductivity type diffusion layers, the second gate electrode being formed in positions such that edges of the second gate electrode overlap at least parts of each of the second high-voltage lightly doped second conductivity type diffusion layers, and one of the second high-voltage lightly doped second conductivity type diffusion layers having a top surface in contact with the interlayer dielectric film, and a pair of second high-voltage heavily doped second conductivity type diffusion layers, one of the second high-voltage heavily doped second conductivity type diffusion layers being formed in one of the second high-voltage lightly doped second conductivity type diffusion layers by self-alignment with the second gate electrode, the other being formed in the other of the second high-voltage lightly doped second conductivity type diffusion layers at a distance along the top surface of the one of the pair of second high-voltage lightly doped second conductivity type diffusion layers from the second gate electrode, and having a top surface in contact with the interlayer dielectric film and a side surface in contact with a field oxide layer of an isolation region.

2. The semiconductor device of claim 1, wherein the second thickness equals the third thickness.

3. The semiconductor device of claim 2, wherein the second high-voltage MOS transistor has a source region surrounded by a third well with a third impurity concentration higher than the first impurity concentration.

4. The semiconductor device of claim 3, wherein the third impurity concentration equals the second impurity concentration.

5. The semiconductor device of claim 1, wherein the second high-voltage MOS transistor is adjacent to the low-voltage MOS transistor.

6. The semiconductor device of claim 1, wherein the first high-voltage MOS transistor is adjacent to the low-voltage MOS transistor.

7. The semiconductor device of claim 6, wherein the first and second high-voltage MOS transistors are both adjacent to the low-voltage MOS transistor.

8. The semiconductor device according to claim 1, wherein the low-voltage MOS transistor further includes a pair of low-voltage lightly doped second conductivity type diffusion layers, the third gate electrode being formed in positions such that edges of the third gate electrode overlap at least parts of each of the low-voltage lightly doped second conductivity type diffusion layers, and a pair of low-voltage heavily doped second conductivity type diffusion layers, one of the low-voltage heavily doped second conductivity type diffusion layers being formed in one of the low-voltage lightly doped second conductivity type diffusion layers by self alignment with the third gate electrode, the other being formed in the other of the low-voltage lightly doped second conductivity type diffusion layers at a distance from the third gate electrode.

9. The semiconductor device according to claim 1, wherein the distance from the first gate electrode corresponds to a portion of the top surface of the one of the first high-voltage lightly doped second conductivity type diffusion layers in contact with the interlayer dielectric film, and the distance from the second gate electrode corresponds to a portion of the top surface of the one of the second high-voltage lightly doped second conductivity type diffusion layers in contact with the interlayer dielectric film.

* * * * *